(12) United States Patent
Nakamura et al.

(10) Patent No.: US 7,179,552 B2
(45) Date of Patent: Feb. 20, 2007

(54) RESIN COMPOSITION FOR INTERLAYER INSULATION OF MULTILAYER PRINTED WIRING BOARD, ADHESIVE FILM AND PREPREG

(75) Inventors: Shigeo Nakamura, Kawasaki (JP); Kenji Kawai, Kawasaki (JP)

(73) Assignee: Ajinomoto Co., Inc., Tokyo (JP)

( * ) Notice: Subject to any disclaimer, the term of this patent is extended or adjusted under 35 U.S.C. 154(b) by 257 days.

(21) Appl. No.: 10/849,171

(22) Filed: May 20, 2004

(65) Prior Publication Data

US 2005/0008868 A1    Jan. 13, 2005

(30) Foreign Application Priority Data

May 27, 2003 (JP) .............................. 2003-149583
Nov. 6, 2003 (JP) .............................. 2003-377301

(51) Int. Cl.
  *B32B 27/38* (2006.01)
  *B32B 27/04* (2006.01)
  *B32B 27/06* (2006.01)
  *B32B 37/00* (2006.01)
  *C08L 63/00* (2006.01)

(52) U.S. Cl. ................... 428/901; 428/297.4; 428/413; 428/414; 428/415; 428/416; 428/417; 428/418; 523/400; 523/427; 523/428; 525/523; 525/524; 525/529; 525/530; 525/532; 525/533

(58) Field of Classification Search ...................... None
See application file for complete search history.

(56) References Cited

U.S. PATENT DOCUMENTS 5,006,611 A * 4/1991 Schmid et al. .............. 525/423

6,403,221 B1 * 6/2002 Nakamura et al. .......... 428/416
6,881,293 B2    4/2005 Nakamura et al.
2004/0099367 A1  5/2004 Nakamura et al.

FOREIGN PATENT DOCUMENTS

| JP | 61-197624 | * | 9/1986 |
| JP | 11-087927 |   | 3/1999 |
| JP | P3108412  |   | 9/2000 |
| JP | 2001-354936 | * | 12/2001 |
| WO | WO 01/97582 |   | 12/2001 |

OTHER PUBLICATIONS

Machine translation of JP 2001-354936, provided by the JPO website.*
English abstract of JP 61-197624.*
English translation of JP 61-197624.*

* cited by examiner

*Primary Examiner*—Michael J. Feely
(74) *Attorney, Agent, or Firm*—Oblon, Spivak, McClelland, Maier & Neustadt, P.C.

(57) ABSTRACT

Resin compositions which comprise the following components (A) to (E) are useful for interlayer insulation of a multilayer printed wiring board:
  (A) an epoxy resin having 2 or more epoxy group in one molecule and which exists in a liquid state at a temperature of 20° C.;
  (B) an aromatic epoxy resin having 3 or more epoxy groups in one molecule and an epoxy equivalent of 200 or less;
  (C) a phenol type curing agent;
  (D) one or more resins selected from the group consisting of a phenoxy resin, a polyvinyl acetal resin, a polyamide resin, a polyamideimide resin, and mixtures thereof, and having a glass transition temperature of 100° C. or more; and
  (E) an inorganic filler.

20 Claims, 2 Drawing Sheets

RESIN COMPOSITION FOR INTERLAYER INSULATION OF MULTILAYER PRINTED WIRING BOARD, ADHESIVE FILM AND PREPREG

CROSS REFERENCES TO RELATED APPLICATIONS

This application claims priority to Japanese Patent Application No. JP2003-149583, filed on May 27, 2003, and Japanese Patent Application No. JP2003-377301, filed on Nov. 6, 2003, both of which are incorporated herein by reference in their entireties.

BACKGROUND OF THE INVENTION

1. Field of the Invention

The present invention relates to resin compositions useful as an interlayer insulating material for buildup type multilayer printed wiring boards formed by accumulating conductor layers having circuits formed therein and insulating layers. The present invention also relates to adhesive films and prepregs for multilayer printed wiring boards prepared from such a resin composition. The present invention further relates to multilayer printed wiring boards having an insulating layer formed with a cured product of such a resin composition or the prepreg. The present invention also relates to processes for producing a multilayer printed wiring board.

DISCUSSION OF THE BACKGROUND

In recent years, electronic devices have become more miniaturized and sophisticated, and the buildup layers of a multilayer printed wiring board have multiplied, due to the increased demand for multilayer printed wiring boards that have a multistage via structure referred to as a staggered via or a stacked via in which the via holes are connected over the plurality of buildup layers. However, due to a large difference in thermal expansion coefficient between the insulating layer and the copper wiring, with which the via holes are connected in multilayer printed wiring boards having the multistage via structure, cracks are formed in the copper wiring or the insulating layer upon carrying out a reliability test, such as thermal cycle. Under such circumstances, it is necessary that the thermal expansion coefficient of a resin composition constituting the insulating layer is reduced to a lower level.

As means for reducing the thermal expansion coefficient, it is generally known to add an inorganic filler to the resin composition and that a larger reduction of the thermal expansion coefficient can be obtained when the addition amount of the inorganic filler is increased. In the conventional circumstance, however, in the case where a large amount of an inorganic filler is contained in an insulating layer, the shape of the via hole deteriorates, and the processing speed is lowered due to the difference in thermal decomposition temperature between the resin and the inorganic filler with a carbon dioxide gas laser, which is mainly used for forming a via hole in an insulating layer. For example, JP-A No. 11-87927 discloses that the content of the inorganic filler is preferably 30% by weight or less from the standpoint of laser processing. However, in view of the progress of a carbon dioxide laser and the propagation of an UV-YAG laser in this field, a resin composition containing even a large amount of an inorganic filler can be processed with a laser without severe problems under the current situation.

As a method for plating suitable for forming a high density wiring in the buildup process, it is known to roughen the surface of the insulating layer with an oxidizing agent, such as an alkaline permanganic acid solution, and then a conductor layer is formed by electroless plating or a combination of electroless plating and electrolytic plating. In this method, however, in the case where a large amount of an inorganic filler is contained in the insulating layer, the area in which the inorganic filler is exposed to the surface after roughening is increased with the result that the peel strength of the conductor layer formed by plating is lowered. According to the experience of the inventors, in the case where an inorganic filler is contained in a resin composition in an amount of 35% by weight or more, especially 40% by weight or more, it is very difficult to obtain the peel strength required for a stable multilayer printed wiring board.

SUMMARY OF THE INVENTION

Accordingly, it is one object of the present invention to provide novel resin compositions, for interlayer insulation of a multilayer printed wiring board, which are capable of forming an insulating layer having a low thermal expansion coefficient and exhibiting excellent peel strength with a conductor layer.

It is another object of the present invention to provide adhesive films and prepregs for a multilayer printed wiring board prepared from such resin compositions.

It is another object of the present invention to provide novel processes for producing a multilayer printed wiring board, in which an insulating layer is introduced with such an adhesive film or prepreg.

It is another object of the present invention and to provide multilayer printed wiring boards having an insulating layer formed with a cured product of such a resin composition or prepreg.

These and other objects, which will become apparent during the following detailed description, have been achieved by the inventors' discovery that a low thermal expansion coefficient and a high peel strength can be simultaneously attained in an insulating layer with a resin composition comprising (A) an epoxy resin having 2 or more epoxy group in one molecule and which exists in a liquid state at a temperature of 20° C.; (B) an aromatic epoxy resin having 3 or more epoxy groups in one molecule and having an epoxy equivalent of 200 or less; (C) a phenol type curing agent; and (D) one or more resins selected from the group consisting of a phenoxy resin, a polyvinyl acetal resin, a polyamide resin, a polyamideimide resin, and mixtures thereof, and having a glass transition temperature of 100° C. or more, in particular proportions, and further comprising (E) an inorganic filler in an amount of 35% by weight or more, based on the total weight of the resin composition Thus, the present invention provides the following embodiments (1)–(15).

(1) A resin composition for interlayer insulation of a multilayer printed wiring board, comprising the following components (A) to (E):

(A) an epoxy resin having 2 or more epoxy group in one molecule and which exists in a liquid state at a temperature of 20° C.;

(B) an aromatic epoxy resin having 3 or more epoxy groups in one molecule and having an epoxy equivalent of 200 or less;

(C) a phenol type curing agent;

(D) one or more resins selected from the group consisting of a phenoxy resin, a polyvinyl acetal resin, a polyamide resin, a polyamideimide resin, and mixtures thereof, and having a glass transition temperature of 100° C. or more; and (E) an inorganic filler, wherein:

the inorganic filler (E) is present in an amount of 35% by weight or more based on the total weight of the non-volatile components of the resin composition;

the epoxy resin (A) and the aromatic epoxy resin (B) are present in a weight ratio of from 1:0.3 to 1:2 of epoxy resin (A) to aromatic epoxy resin (B);

the phenol type curing agent (C) is present in an amount such that the ratio of the total epoxy groups in the resin composition and the phenolic hydroxyl groups of the phenol type curing agent is from 1:0.5 to 1:1.5; and the resin (D) is present in an amount of from 2 to 20% by weight based on the total weight of the non-volatile components of the resin composition.

(2) A resin composition for interlayer insulation of a multilayer printed wiring board, comprising the following components (A) to (E):

(A) an epoxy resin having 2 or more epoxy group in one molecule and which exists in a liquid state at a temperature of 20° C.;

(B) an aromatic epoxy resin having 3 or more epoxy groups in one molecule and having an epoxy equivalent of 200 or less;

(C) a phenol type curing agent;

(D) one or more resins selected from the group consisting of a phenoxy resin, a polyvinyl acetal resin, a polyamide resin, a polyamideimide resin, and mixtures thereof, and having a glass transition temperature of 100° C. or more, and (E) an inorganic filler, wherein:

the inorganic filler (E) is present in an amount of 40% by weight or more based on the total weight of the non-volatile components of the resin composition;

the epoxy resin (A) and the aromatic epoxy resin (B) are present in a weight ratio of from 1:0.3 to 1:2 of epoxy resin (A) to aromatic epoxy resin (B);

the phenol type curing agent (C) is present in an amount such that the ratio of the total epoxy groups in the resin composition and the phenolic hydroxyl groups of the phenol type curing agent (C) is from 1:0.5 to 1:1.5; and the resin (D) is present in an amount of from 2 to 20% by weight based on the total weight of the non-volatile components of the resin composition.

(3) The resin composition according to (1) or (2), wherein the epoxy resin (A) is an aromatic epoxy resin.

(4) The resin composition according to (1) or (2), wherein the aromatic epoxy resin (B) has an epoxy equivalent of from 150 to 200.

(5) The resin composition according to (1) or (2), wherein the aromatic epoxy resin (B) exists in a solid state at a temperature of 20° C.

(6) The resin composition according to (1), wherein the inorganic filler (E) is present in an amount of from 35 to 70% by weight based on the total weight of the non-volatile components of the resin composition.

(7) The resin composition according to (2), wherein the inorganic filler (E) is present in an amount of from 40 to 70% by weight based on the total weight of the non-volatile components of the resin composition.

(8) The resin composition according to (1) or (2), wherein the epoxy resin (A) and the aromatic epoxy resin (B) are present in the resin composition in a total amount of from 10 to 50% by weight, based on the total weight of the non-volatile components of the resin composition.

(9) An adhesive film for a multilayer printed wiring board, comprising a support film and a layer of a resin composition according to one of (1) to (8) formed thereon.

(10) The adhesive film according to (9), wherein the resin composition has a melt viscosity measured at a measurement starting temperature of 60° C., a temperature increase rate of 5° C. per minute, and a frequency of 1 Hz/deg, of from 4,000 to 50,000 poise at 90° C., from 2,000 to 21,000 poise at 100° C., from 900 to 12,000 poise at 110° C., from 500 to 9,000 poise at 120° C., and from 300 to 15,000 poise at 130° C.

(11) A prepreg for a multilayer printed wiring board, comprising a reinforcing substrate in a sheet form, and wherein the reinforcing substrate comprises fibers impregnated with a resin composition according to one of (1) to (8).

(12) A multilayer printed wiring board, comprising an insulating layer formed of a cured product of a resin composition according to one of (1) to (8).

(13) A multilayer printed wiring board, comprising an insulating layer formed of a cured product of a prepreg according to (11).

(14) A process for producing a multilayer printed wiring board, comprising:

(a) laminating an adhesive film according to (9) or (10) on one surface or both surfaces of a circuit board;

(b) optionally, removing the support film therefrom;

(c) thermally curing the resin composition laminated on the circuit board, to obtain an insulating layer;

(d) removing support film in a case where the support film exists;

(e) drilling the circuit board having the insulating layer formed thereon;

(f) roughening at least one surface of the insulating layer with an oxidizing agent;

(g) forming a conductor layer by plating on at least one surface of the insulating layer which has been roughened; and (h) forming a circuit in the conductor layer.

(15) A process for producing a multilayer printed wiring board, comprising:

(i) laminating a prepreg according to (11) on one surface or both surfaces of a circuit board;

(j) thermally curing the prepreg laminated on the circuit board, to obtain an insulating layer;

(k) drilling the circuit board having the insulating layer formed thereon;

(l) roughening at least one surface of the insulating layer with an oxidizing agent;

(m) forming a conductor layer by plating on at least one surface of the insulating layer which has been roughened; and (n) forming a circuit in the conductor layer.

According to the invention, an insulating layer that has a low thermal expansion coefficient and exhibits an excellent in peel strength with a conductor layer can be easily introduced into a multilayer printed wiring board. The insulating layer is also excellent in breaking strength.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DETAILED DESCRIPTION OF THE PREFERRED EMBODIMENTS

Examples of the "epoxy resin having 2 or more epoxy group in one molecule and which exists in a liquid state at a temperature of 20° C." as the component (A) include bisphenol A epoxy resins, bisphenol F epoxy resins, phenol novolak epoxy resins, tert-butylcatechol epoxy resins, naphthalene epoxy resins, glycidylamine epoxy resins, and alicyclic epoxy resins. The epoxy resin is preferably an aromatic epoxy resin from the standpoint of preferred properties of a cured product and the like. In the context of the present invention, the term "aromatic epoxy resin" means an epoxy resin having an aromatic skeleton in the molecule thereof. Therefore, the component (A) is more preferably an "aromatic epoxy resin having 2 or more epoxy group in one molecule and which exists in a liquid state at a temperature of 20° C.". The epoxy resins may be used singly or in combination of two or more kinds thereof. The epoxy resin as the component (A) may be in a liquid state at a temperature lower than 20° C. When a material which exists in the solid state at a temperature of 20° C. is used as the component (A), it is difficult to achieve sufficient flexibility at ordinary temperatures at which the adhesive film is handled (about from 20 to 30° C.), such that the handleability of the adhesive film is deteriorated. Furthermore, upon lamination on a circuit board, the resin composition tends to have insufficient flowability for filling via holes and through holes.

Examples of the "aromatic epoxy resin having 3 or more epoxy groups in one molecule and an epoxy equivalent of 200 or less" (component (B)) include naphthalene epoxy resins and epoxidized products of a condensate of a phenol compound and an aromatic aldehyde having a phenolic hydroxyl group (a trisphenol epoxy resin), and specific examples thereof include EXA4700, produced by Dainippon Ink And Chemicals, Inc. (tetrafunctional naphthalene epoxy resin) and EPPN-502H, produced by Nippon Kayaku Co., Ltd. (trisphenol epoxy resin). The epoxy resins may be used solely or in combination of two or more kinds thereof. The component (B) preferably has an epoxy equivalent of from 150 to 200 and exists in a solid state at a temperature of 20° C. Therefore, the component (B) is preferably an "aromatic epoxy resin having 3 or more epoxy groups in one molecule and an epoxy equivalent of from 150 to 200," and more preferably an "aromatic epoxy resin having 3 or more epoxy groups in one molecule and an epoxy equivalent of from 150 to 200, and which exists in a solid state at a temperature of 20° C." The component (B) improves the breaking strength of the cured product of the resin composition and improves the crosslinking density of the cured product, so as to suppress the inorganic filler from being exposed on the surface of the cured product after the roughening treatment, whereby it fulfills such an important function that a high plating peel strength is stably obtained. An epoxy resin having an epoxy equivalent of from 150 to 200 and which exists in a solid state at a temperature of 20° C. is preferred for exerting this function.

The mixing ratio of the component (A) and the component (B) in the resin composition of the present invention is in a range of from 1:0.3 to 1:2, by weight, (A) to (B). It is particularly preferably in a range of from 1:0.5 to 1;1. In the case where the amount of the component (A) is too large, exceeding the range, the tackiness of the resin composition becomes large, and the deaeration property upon vacuum lamination deteriorates resulting in the occurrence of voids, or in alternative, the heat resistance after curing becomes insufficient. In the case where the amount of the component (B) is too large, exceeding the range, the resin composition becomes brittle at ordinary temperatures, and handling thereof upon using as an adhesive film becomes difficult.

The total amount of the component (A) and the component (B) in the resin composition (100% by weight of non-volatile component) is generally from 10 to 50% by weight, and preferably from 20 to 40% by weight.

The resin composition of the invention may contain a polyfunctional epoxy resin or a monofunctional epoxy resin other than the components (A) and (B) to such an extent that does not impair the effect of the invention.

Examples of the "phenol type curing agent" as the component (C) include phenol curing agents, such as phenol novolak resins, alkylphenol novolak resins, triazine structure-containing novolak resins, bisphenol A novolak resins, dicyclopentadiene phenol resins, Xylok phenol resins, terpene-modified phenol resins, and polyvinylphenol compounds; naphthalene curing agents and fluorine curing agents. The phenol type curing agents may be used solely or in combination of two or more kinds thereof.

The phenol type curing agent is mixed in such a manner that the ratio of the total number of epoxy groups present in the resin composition and the total number of phenolic hydroxyl groups of the phenol type curing agent (C) is from 1:0.5 to 1:1.5, preferably 1:0.75 to 1:1.25. In the case where the resin composition contains an epoxy resin other than the component (A) and the component (B), the mixing ratio is determined under consideration including the epoxy groups of the other epoxy resin. In the case where the mixing ratio of the phenol type curing agent is outside the range, there are some cases where the heat resistance of the cured product of the resin composition is insufficient.

In addition to the phenol type curing agent, an organic phosphine compound, such as triphenylphosphine; an imidazole compound, such as 2-ethyl-4-methylimidazole; and the like may be added as a curing accelerator. In the case where the curing accelerator is used, the mixing amount thereof is preferably from 0.5 to 2% by weight with based on the mixing amount of the phenol type curing agent being 100% by weight.

The "one or more resins selected from the group consisting of a phenoxy resin, a polyvinyl acetal resin, a polyamide resin, a polyamideimide resin, and mixtures thereof, and having a glass transition temperature of 100° C. or more" as the component (D) will now be described.

Specific examples of the phenoxy resin include FX280 and FX293, produced by Tohto Kasei Co., Ltd., and YX8100, YL6954 and YL6974, produced by Japan Epoxy Resins Co., Ltd. Specific examples of the polyvinyl acetal resin include S-Lec KS Series, produced by Sekisui Chemical Co., Ltd.; specific examples of the polyamide resin include KS5000 Series, produced by Hitachi Chemical Co., Ltd., and BP Series, produced by Nippon Kayaku Co., Ltd.; and specific examples of the polyamideimide resin include KS9000 Series produced by Hitachi Kasei Co., Ltd. These resins may be used solely or in combination of two or more kinds thereof. The resin as the component (D) is particularly preferably a phenoxy resin and a polyvinyl acetal resin.

The glass transition temperature is determined according to the method described in JIS (Japanese Industrial Standards) K7197. The case in which no glass transition temperature is observed due to the glass transition temperature being higher than the decomposition temperature is also included in the definition of the component (D) of the present invention, i.e., "having a glass transition temperature of 100° C. or mor." The decomposition temperature is defined as the temperature, at which the mass decrease rate measured according to the method described in JIS K7120 becomes 5%.

The component (D) exerts an important influence on thermal flowability of the resin composition upon lamination and on roughening of the cured product with the oxidizing agent. In the case where the glass transition temperature of the component (D) is less than 100° C., the mechanical strength of the cured product is insufficient, and the inorganic filler is liable to be exposed on the surface of the cured product after roughening resulting in a failure to obtain sufficient plating peel strength.

The content ratio of the component (D) in the resin composition (100% by weight of non-volatile component) is from 2 to 20% by weight, preferably 5 to 15% by weight. In the case where it is less than 2% by weight, the thermal flowability of the resin composition on lamination becomes too large resulting in unevenness of the thickness of the insulating layer, or in alternative, the roughening property of the cured product becomes insufficient. In the case where it exceeds 20% by weight, on the other hand, the thermal flowability becomes too low, and the resin composition cannot be sufficiently filled in via holes and through holes present in the circuit board.

The content ratio of the inorganic filler as the component (E), depends on the required properties of the resin composition and is 35% by weight or more, or 40% by weight or more, based on the resin composition (100% by weight of non-volatile component). The range is more preferably from 35 to 75% by weight, or from 40 to 75% by weight. In the case where it is less than 35% by weight, the thermal expansion coefficient is too high, and the effect of the invention cannot be obtained. In the case where it exceeds 75% by weight, there is such a tendency that the peel strength is lowered.

Examples of the inorganic filler include silica, alumina, barium sulfate, talc, clay, mica powder, aluminum hydroxide, magnesium hydroxide, calcium carbonate, magnesium carbonate, magnesium oxide, boron nitride, aluminum borate, barium titanate, strontium titanate, calcium titanate, magnesium titanate, bismuth titanate, titanium oxide, barium zirconate and calcium zirconate. Silica is particularly preferred. The inorganic filler preferably has an average particle diameter of 5 μm or less. In the case where the average particle diameter exceeds 5 μm, there are some cases where upon forming a circuit pattern on a conductor layer, a fine pattern cannot be stably formed. In order to improve the moisture resistance of the inorganic filler, the surface thereof is preferably treated with a surface treating agent, such as a silane coupling agent.

In addition to the aforementioned components, the resin composition may be mixed with other components, such as a thermosetting resin and additives so far as the effect of the present invention is not obstructed. Examples of the thermosetting resin include a blocked isocyanate resin, a xylene resin, and a radical generator and a polymerizable resin. Examples of the additives include an organic filler, such as silicone powder, nylon powder and fluorine powder, a thickener, such as Orben and Benton, a defoaming agent or a leveling agent, such as a silicone series, a fluorine series and a polymer series, an adhesiveness imparting agent, such as an imidazole series, a thiazole series, a triazole series and a silane coupling agent, and a coloring agent, such as phthalocyanine blue, phthalocyanine green, iodine green, disazo yellow, and carbon black.

The resin composition of the present invention is coated on a support film to form a resin composition layer, so as to provide an adhesive film for a multilayer printed wiring board, or in the alternative, a reinforcing substrate in a sheet form formed with fibers is impregnated with the resin composition to form a prepreg for an interlayer insulating layer of a multilayer printed wiring board. The resin composition of the present invention may be coated on a circuit board to form an insulating layer, but in industrial procedures, it is used in a form of an adhesive film or a prepreg for forming an insulating layer.

The resin composition constituting the resin composition layer in the adhesive film of the invention is preferably such a material that is softened at a temperature condition of lamination used in the vacuum lamination method (generally from 70 to 140° C.) and exhibits such flowability (resin flow) such that the resin fills in via holes and through holes present in the circuit board simultaneously with lamination of the circuit board. The through hole of the multilayer printed wiring board generally has a diameter of from 0.1 to 0.5 mm and a depth of from 0.1 to 1.2 mm, and it is preferred that the resin can be filled therein in these ranges. In the case where both surfaces of the circuit board are laminated, it is sufficient that ½ depth of the through hole is filled therewith. These physical properties can be characterized by a temperature-melt viscosity curve of the resin composition by measurement of dynamic viscoelasticity.

Figure 4:
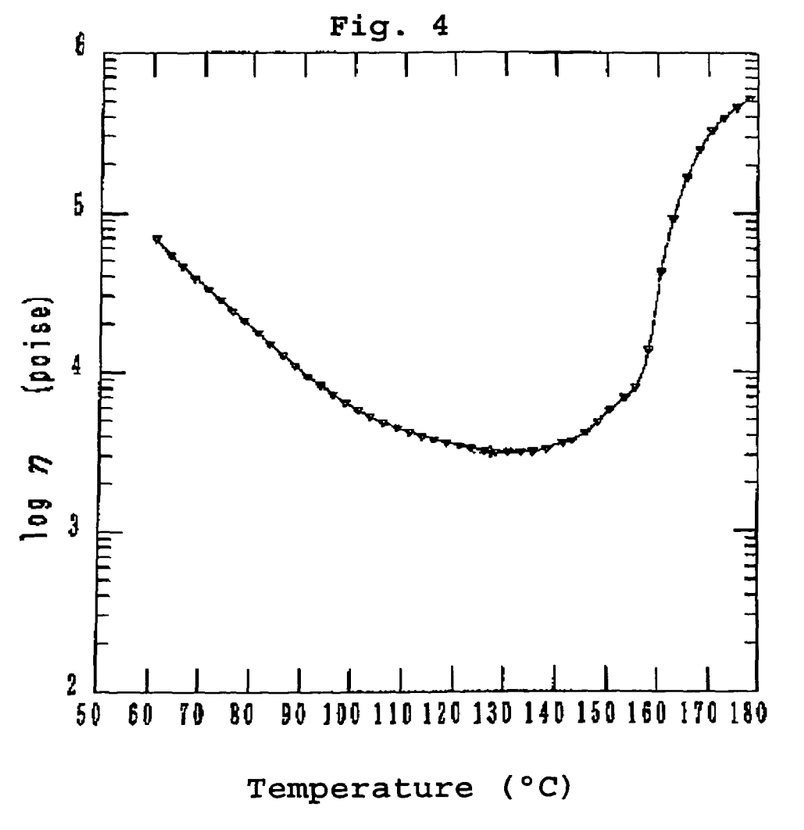
FIG. 4 shows the results of the measurement of the dynamic viscoelasticity of the resin composition of the adhesive film obtained in Example 1.

The dynamic viscoelasticity is measured based on the resin composition obtained in Example 1 described later, and an example of the temperature-melt viscosity ($\eta$) relationship is shown in FIG. 4. FIG. 4 is a curve showing the melt viscosity of the resin composition upon heating at a temperature increase rate of 5° C. per minute, a starting temperature is 60° C., and frequency is 1 Hz/deg. For the resin composition of the present invention, it is preferable to use one that has a melt viscosity measured at a measurement starting temperature of 60° C., a temperature increase rate of 5° C. per minute, and a frequency of 1 Hz/deg of from 4,000 to 50,000 poise at 90° C., from 2,000 to 21,000 poise at 100° C., from 900 to 12,000 poise at 110° C., from 500 to 9,000 poise at 120° C., a 300 to 15,000 poise at 130° C., as shown in the following Table 1.

TABLE 1

| Temperature (° C.) | Melt viscosity (poise) |
| --- | --- |
| 90 | 4,000–50,000 |
| 100 | 2,000–21,000 |
| 110 | 900–12,000 |
| 120 | 500–9,000 |
| 130 | 300–15,000 |

By using the resin composition having such melt viscosity properties, the lamination of the resin composition on a surface of circuit board and the filling of the resin composition in the through hole and/or via hole can be performed simultaneously and integrally. In the case where the melt viscosity is too low, the flowability of the resin composition is too large upon laminating the resin composition to a circuit board by the vacuum lamination method or thermally curing the same, so that the thickness of the resin layer trends to become uneven. In the case where the melt viscosity is too high, the flowability of the resin composition is too small so that the resin tends to be insufficiently filled in the via holes and through holes (see International Publication WO 01/97582). A skilled person in the art can easily prepare an adhesive film having melt viscosity characteristics suitable for the vacuum lamination method based on the description of the epoxy resin composition and the adhesive film of the invention and the description of International Publication WO 01/97582.

The adhesive film of the present invention can be produced by a method well known by a skilled person in the art, for example, a resin varnish is prepared by dissolving the resin composition in an organic solvent, the resin varnish is coated on a support film as a support, and the organic solvent is dried by heating or blowing hot air, so as to form a resin composition layer.

Examples of the organic solvent include a ketone compound, such as acetone, methyl ethyl ketone, and cyclohexanone; an acetate compound, such as ethyl acetate, butyl acetate, cellosolve acetate, propylene glycol monomethylether acetate, and carbitol acetate; a carbitol compound, such as cellosolve and butylcarbitol; an aromatic hydrocarbon compound, such as toluene and xylene; dimethylformamide; dimethylacetamide; and N-methylpyrrolidone. The organic solvents may be used in combination of two or more kinds thereof.

The drying condition is not particularly limited, and the drying is generally carried out such that the content of the organic solvent in the resin composition layer is 10% by weight or less, and preferably 5% by weight or less. The melt viscosity curve of the resin composition layer thus formed is also influenced by the drying conditions, and it is preferred that the drying conditions are configured to satisfy the aforementioned melt viscosity characteristics. Although depending on the amount of the organic solvent in the varnish, the varnish containing from 30 to 60% by weight of the organic solvent can be dried at a temperature of from 50 to 150° C. for from 3 to 10 minutes. The preferred drying condition can be appropriately configured by a skilled person in the art or through simple experimentation.

The thickness of the resin composition layer thus formed is generally equal to or larger than the thickness of the conductor layer. Since the thickness of the conductor layer contained in the circuit board is generally in a range of from 5 to 70 µm, the thickness of the resin composition layer is preferably from 10 to 100 µm.

The resin composition layer of the invention may be protected by a protective film described below. The adhesion of dust and damage to the surface of the resin composition layer can be prevented by protecting with a protective film.

Examples of the support film and the protective film in the invention include polyolefins, such as polyethylene, polypropylene, and polyvinyl chloride; polyesters, such as polyethylene terephthalate (hereinafter, sometimes abbreviated as "PET") and polyethylene naphthalate; polycarbonates; polyimides; releasing paper; and metallic foil, such as copper foil and aluminum foil. The support film and the protective film may be subjected to a matting treatment, corona treatment, and/or releasing treatment.

The thickness of the support film is not particularly limited, and is generally from 10 to 150 µm, and preferably from 25 to 50 µm. The thickness of the protective film is preferably from 1 to 40 µm. A support film used as a support in the production process of the adhesive film may be used as the protective film for protecting the surface of the resin composition layer, as described below.

The support film in the present invention is released after laminating to a circuit board or after forming an insulating layer through thermal curing. In the case where the support film is released after thermally curing the adhesive film, the adhesion of dust upon curing process can be prevented. In the case where it is released after curing, the support film is generally subjected to a releasing treatment. The resin composition layer formed on the support film is preferably formed in such a manner that the area of the layer is smaller than the area of the support film. The adhesive film may be wound in a roll form for preservation and storage.

Next, the process for producing a multilayer printed wiring board of the present invention by using the adhesive film of the present invention will be described. In the case where the resin composition layer is protected by the protective film, it is released, and then the resin composition layer is laminated on one surface or both surfaces of a circuit board in such a manner that the resin composition layer is in direct contact with the circuit board. As for the adhesive film of the invention, a method of laminating to the circuit board by the vacuum lamination method is preferably employed. The method of lamination may be batchwise or continuous in the form of a roll. It is also possible that the adhesive film and the circuit board may be heated before lamination (preheating) depending on requirements.

The conditions of lamination are preferably to set at a press temperature (lamination temperature) of from 70 to 140° C., a press pressure of from 1 to 11 kgf/cm$^2$ ($9.8 \times 10^4$ to $107.9 \times 10^4$ N/m$^2$), and it is preferable to laminate under reduced pressure at air pressure of 20 mmHg (26.7 hPa) or less.

The vacuum lamination may be carried out with a commercially available vacuum laminator. Examples of commercially available laminators include Vacuum Applicator, produced by Nichigo-Morton Co., Ltd., Vacuum Pressurizing Laminator, produced by Meiki Co., Ltd., Rolling Dry Coater, produced by Hitachi Industries Co., Ltd, and Vacuum Laminator, produced by Hitachi AIC Inc.

The circuit board used in the present invention mainly includes a substrate board, such as a glass epoxy board, a metallic board, a polyester board, a polyimide board, a BT resin board and a thermosetting polyphenylene ether board, having a patterned conductor layer (circuit) formed on one surface or both surfaces thereof. The circuit board used in the present invention also includes a multilayer printed wiring board, in which conductor layers and insulating layers are alternately laminated, and conductor layers (circuits) are formed on one surface or both surfaces thereof. It is preferred that the surface of the conductor circuit layer is previously subjected to a roughening treatment, such as a black oxide plating treatment, from the standpoint of adhesiveness of the insulating layer to the circuit board.

After thus laminating the adhesive film to the circuit board, the support film is released depending on necessity, and an insulating layer can be formed on the circuit board through thermal curing. The conditions for thermal curing can be selected from ranges of from 150 to 220° C. and from 20 to 180 minutes, and more preferably from 160 to 200° C. and from 30 to 120 minutes.

After forming the insulating layer, the support film is released if it has not yet been released before curing. Holes are then formed in the insulating layer formed on the circuit board to form via holes and through holes. The formation of holes can be carried out by the known method, such as drilling, laser and plasma, or by a combination of these methods depending on necessity, and the most popular method is formation of holes by laser, such as carbon dioxide gas laser and YAG laser.

The surface of the insulating layer is then subjected to a roughening treatment with an oxidizing agent. Examples of the oxidizing agent include a permanganate salt (such as potassium permanganate and sodium permanganate), a bichromate salt, ozone, a combination of hydrogen peroxide and sulfuric acid, and nitric acid. It is preferred that roughening is carried out by using an alkaline permanganic acid solution (such as a sodium hydroxide aqueous solution of potassium permanganate or sodium permanganate), which is an oxidizing agent generally used for roughening an insulating layer during the production of multilayer printed wiring boards by the buildup process.

A conductor layer is then formed by a method combining electroless plating and electrolytic plating on the surface of the resin composition layer having anchors of roughness formed thereon through the roughening treatment. It is also possible that the conductor layer is formed only by electroless plating through formation of a plating resist having a pattern inverse to the conductor layer. After it is formed, the conductor layer is subjected to an annealing treatment at from 150 to 200° C. for from 20 to 90 minutes, whereby the peel strength of the conductor layer can be further improved and stabilized. According to the present invention, such a peel strength of the conductor layer can be obtained that is preferred for a multilayer printed wiring board. The peel strength preferred for a multilayer printed wiring board is generally 0.6 kgf/cm or more, and preferably 0.7 kgf/cm or more.

Examples of the method for forming the circuit by patterning the conductor layer include the subtractive method and the semiadditive method, which are known by a skilled person in the art.

The prepreg of the invention can be produced by impregnating a reinforcing substrate formed with fibers in a sheet form with the resin composition of the present invention by the hot melt method or the solvent method, followed by subjecting to semi-curing by heating. That is, the prepreg may be in such a state that a sheet reinforcing substrate formed with fibers is impregnated with the resin composition of the present invention.

As the sheet reinforcing substrate formed with fibers, those generally used for fibers for prepregs, such as glass cloth and aramid fibers, can be used.

The hot melt method is such a method that a resin not dissolved in an organic solvent is once coated on coated paper having good releasing property to the resin, and it is laminated to the sheet reinforcing substrate, or in alternative, it is directly coated thereon with a die coater, so as to produce the prepreg. The solvent method is a method such that, in a manner similar to the adhesive film, the sheet reinforcing substrate is immersed in a resin varnish formed by dissolving the resin in an organic solvent, so as to impregnate the sheet reinforcing substrate with the resin varnish, followed by drying.

A method for producing the multilayer printed wiring board of the invention by using the prepreg of the invention will now be described. One or plural, depending on necessity, prepregs of the invention are accumulated on a circuit board, and the assembly is held with metallic plates through releasing films and press-laminated under application of pressure and heat. The molding is preferably carried out at a pressure in a preferred range of from 5 to 40 kgf/cm$^2$, and a temperature in a preferred range of from 120 to 200° C., for from 20 to 100 minutes. In a manner similar to the adhesive film, it can also be produced by lamination to a circuit board by the vacuum lamination method, and then thermally curing. Thereafter, in a manner similar to the aforementioned process, the surface of the prepreg thus cured is roughened with an oxidizing agent, and then a conductor layer is formed by plating, so as to produce the multilayer printed wiring board.

Other features of the invention will become apparent in the course of the following descriptions of exemplary embodiments which are given for illustration of the invention and are not intended to be limiting thereof.

EXAMPLES

In the following examples, all "parts" are parts by weight.

Example 1

20 parts of a liquid bisphenol F epoxy resin (epoxy equivalent: 170, Epikote 807, produced by Japan Epoxy Resins Co., Ltd.) as the component (A) and 12 parts of a naphthalene tetrafunctional epoxy resin (epoxy equivalent: 163, EXA-4700, produced by Dainippon Ink And Chemicals, Inc.) as the component (B) were dissolved in 10 parts of methyl ethyl ketone (hereinafter, abbreviated as MEK) and 10 parts of cyclohexanone with heat while stirring. 25 parts of an MEK varnish of a triazine structure-containing phenol novolak resin (Phenolite LA-7052, produced by Dainippon Ink And Chemicals, Inc.) as the component (C), 20 parts of a phenoxy resin varnish (non-volatile component: 40% by weight, glass transition temperature: 163° C., FX293, produced by Tohto Kasei Co., Ltd.) as the component (D), and 60 parts of spherical silica (average particle diameter: 1 μm, aminosilane treatment) as the component (E) were added thereto to produce a resin varnish (inorganic filler content based on non-volatile component of resin varnish: 52% by weight).

Then, the resin varnish was coated on polyethylene terephthalate (thickness: 38 μm, hereinafter, abbreviated as PET) by a die coater to make a resin thickness of 70 μm after drying, followed by drying at from 80 to 120° C. (average: 100° C.) for 6 minutes (residual-solvent amount: about 1% by weight). A polypropylene film having a thickness of 15 μm was superimposed on the surface of the resin composition, while simultaneously winding into a roll. The adhesive film in a roll was slit to a width of 507 mm to obtain an adhesive film in a sheet form having a size of 507×336 mm.

Example 2

15 parts of a liquid bisphenol A epoxy resin (epoxy equivalent: 185, Epikote 828EL, produced by Japan Epoxy Resins Co., Ltd.) as the component (A) and 15 parts of a trisphenol epoxy resin (epoxy equivalent: 176, EPPN-502H, produced by Nippon Kayaku Co., Ltd.) as the component (B) were dissolved in 10 parts of MEK and 10 parts of cyclohexanone with heat while stirring. 25 parts of an MEK varnish of a triazine structure-containing phenol novolak resin (Phenolite LA-7052, produced by Dainippon Ink And Chemicals, Inc.) as the component (C), 25 parts of a polyamideimide resin varnish (non-volatile component:

33% by weight, glass transition temperature: 180° C., KS9300, produced by Hitachi Chemical Co., Ltd.) as the component (D), and 30 parts of spherical silica (average particle diameter: 1 µm, aminosilane treatment) and 10 parts of kaolin (average particle diameter: 3 µm, aminosilane treatment) as the component (E) were added thereto to produce a resin varnish (inorganic filler content based on non-volatile component of resin varnish: 43% by weight).

In a manner similar to Example 1, the resin varnish was coated on PET by a die coater to make a resin thickness of 70 µm after drying, followed by drying at from 80 to 120° C. (average: 100° C.) for 6 minutes (residual solvent amount: about 2% by weight). A polypropylene film having a thickness of 15 µm was superimposed on the surface of the resin composition, while simultaneously winding into a roll. The adhesive film in a roll was slit to a width of 507 mm to obtain an adhesive film in a sheet form having a size of 507×336 mm.

Example 3

20 parts of a liquid bisphenol F epoxy resin (epoxy equivalent: 170, Epikote 807, produced by Japan Epoxy Resins Co., Ltd.) as the component (A), 12 parts of a naphthalene tetrafunctional epoxy resin (epoxy equivalent: 163, EXA-4700, produced by Dainippon Ink And Chemicals, Inc.) as the component (B) and further 10 parts of a cresol novolak epoxy resin (epoxy equivalent: 220, N-690, produced by Dainippon Ink And Chemicals, Inc.) were dissolved in 20 parts of MEK and 10 parts of cyclohexanone with heat while stirring. 30 parts of an MEK varnish of a triazine structure-containing phenol novolak resin (non-volatile component: 60% by weight, a phenolic hydroxyl group equivalent of non-volatile component: 120, Phenolite LA-7052, produced by Dainippon Ink And Chemicals, Inc.) as the component (C), 20 parts of a phenoxy resin varnish (non-volatile component: 40% by weight, glass transition temperature: 163° C., FX293, produced by Tohto Kasei Co., Ltd.) as the component (D), 15 parts of polyvinyl acetal resin (non-volatile component: 15% by weight, glass transition temperature: 107° C., KS1, produced by Sekisui Chemical Co., Ltd.) and further 60 parts of spherical silica (average particle diameter: 1 µm, aminosilane treatment) as the component (E) were added thereto to produce a resin varnish (inorganic filler content based on non-volatile component of resin varnish: 36% by weight).

Then the resin varnish was coated on PET (thickness: 38 µm) by a die coater to make a resin thickness of 70 µm after drying, followed by drying at from 80 to 120° C. (average: 100° C.) for 6 minutes (residual solvent amount: about 1% by weight). A polypropylene film having a thickness of 15 µm was superimposed on the surface of the resin composition, while simultaneously winding into a roll. The adhesive film in a roll form was slit to a width of 507 mm to obtain an adhesive film in a sheet form having a size of 507×336 mm.

Example 4

Glass cloth was impregnated with the resin varnish of Example 1 and dried at from 80 to 120° C. (average: 100° C.) for 6 minutes to obtain a prepreg having a resin content of 45% by weight and a thickness of 0.1 mm.

Comparative Example 1

20 parts of a liquid bisphenol F epoxy resin (epoxy equivalent: 170, Epikote 807, produced by Japan Epoxy Resins Co., Ltd.) and 12 parts of a cresol novolak epoxy resin (epoxy equivalent: 210, N673, produced by Dainippon Ink And Chemicals, Inc.) were dissolved in 10 parts of MEK and 10 parts of cyclohexanone with heat while stirring. 25 parts of an MEK varnish of a triazine structure-containing phenol novolak resin (Phenolite LA-7052, produced by Dainippon Ink And Chemicals, Inc.), 23 parts of a phenoxy resin varnish (non-volatile component: 35% by weight, glass transition temperature: 84° C., YB-50-EK35, produced by Tohto Kasei Co., Ltd.), and 60 parts of spherical silica (average particle diameter: 1 µm, aminosilane treatment) were added thereto to produce a resin varnish (inorganic filler content based on non-volatile component of resin varnish: 52% by weight).

Then, in a manner similar to Example 1, the resin varnish was coated on PET by a die coater to make a resin thickness of 70 µm after drying, followed by drying at from 80 to 120° C. (average: 100° C.) for 6 minutes (residual solvent amount: about 1% by weight). A polypropylene film having a thickness of 15 µm was superimposed on the surface of the resin composition, while simultaneously winding into a roll. The adhesive film in a roll was slit to a width of 507 mm to obtain an adhesive film in a sheet form having a size of 507×336 mm.

Example 5

An inner layer circuit board was produced from an FR4 double sided copper clad laminated plate having a copper foil thickness of 18 µm and a plate thickness of 0.3 mm (having a through hole having a diameter of 0.2 mm), and after releasing the polypropylene film from the adhesive film obtained in Example 1, it was laminated on both surfaces thereof to make the resin composition layer facing the circuit surface by a vacuum laminator, produced by Meiki Co., Ltd., at a temperature of 110° C., a pressure of 7 kgf/cm$^2$ and an atmospheric pressure of 5 mmHg (1.33 hPa) or less. The PET film is then released, and the assembly was thermally cured at 180° C. for 30 minutes. Thereafter, holes were formed by laser to form via holes, and the surface of the resin composition layer thus cured was subjected to a roughening treatment with an alkaline oxidizing agent of a permanganate salt and was subjected to electroless and electrolytic plating to form circuits according to the subtractive method, so as to obtain a four-layer printed wiring board. Thereafter, it was subjected to an annealing treatment at 180° C. for 30 minutes. The thus-obtained conductor layer had a conductor thickness of about 30 µm and a peel strength of 0.9 kgf/cm, and the through holes were filled with resin fully. The peel strength was evaluated according to Japanese Industrial Standards (JIS) C6481.

Example 6

A four-layer printed wiring board was fabricated in the same manner as in Example 5, with the exception of using the adhesive film obtained in Example 2. The thus-obtained conductor layer had a conductor thickness of about 30 µm and a peel strength of 0.8 kgf/cm, and the through holes were filled with resin fully.

Example 7

A four-layer printed wiring board was fabricated in the same manner as in Example 5, with the exception of using the adhesive film obtained in Example 2. The conductor layer thus obtained had a conductor thickness of about 30 µm and a peel strength of 0.9 kgf/cm, and the through holes were filled with resin fully.

Example 8

The prepreg obtained in Example 4 was layered on the same circuit board as used in Example 5, and the assembly was held with metallic plates through releasing films and subjected to vacuum lamination press at 120° C. and 10 kgf/cm² for 15 minutes and then vacuum lamination press at 180° C. and 40 kgf/cm² for 60 minutes. Thereafter, a four-layer printed wiring board was obtained in the same manner as in Example 5. The conductor layer thus obtained had a peel strength of 0.8 kgf/cm.

Comparative Example 2

A four-layer printed wiring board was fabricated in the same manner as in Example 5, with the exception of using the adhesive film obtained in Comparative Example 1. The thus-obtained conductor layer had a peel strength of 0.4 kgf/cm.

Evaluation of Resin Surface after Roughening

Figure 1:
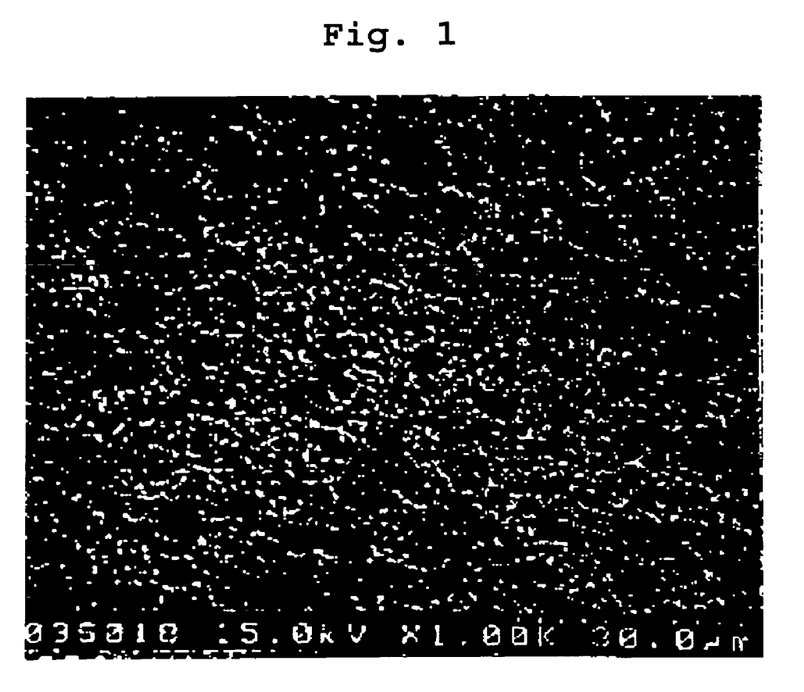
FIG. 1 is a scanning electron microscope (SEM) photograph, taken at a magnification of 1,000, of the surface of the cured product of the resin composition after the roughening treatment in Example 5.
Figure 2:
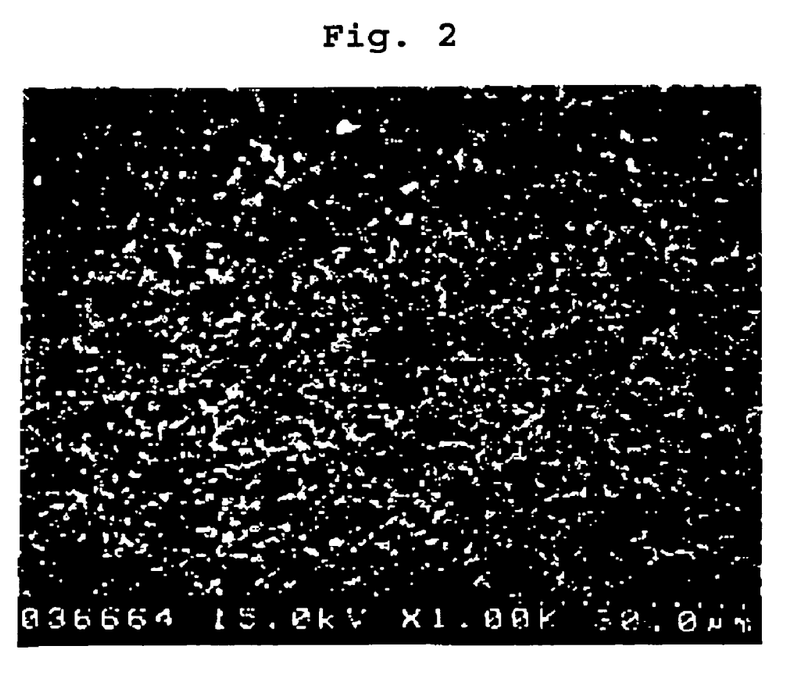
FIG. 2 is a SEM photograph, taken at a magnification of 1,000, of the surface of the cured product of the resin composition after the roughening treatment in Example 6.
Figure 3:
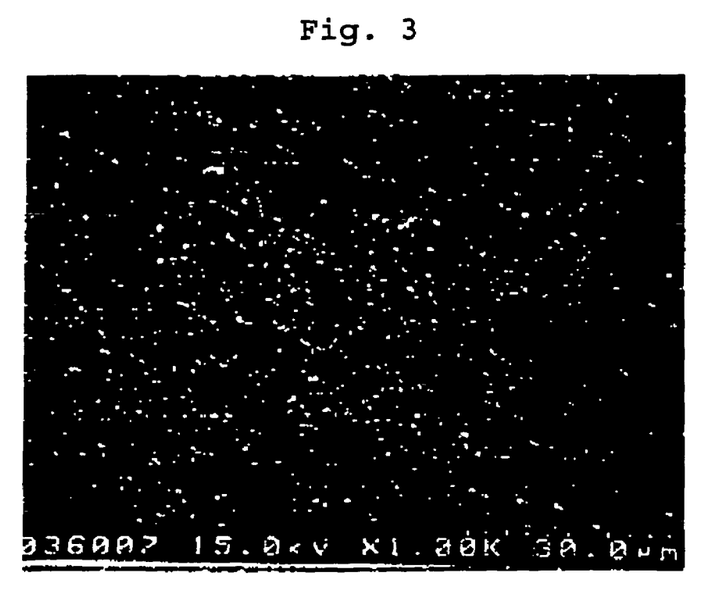
FIG. 3 is a SEM photograph, taken at a magnification of 1,000, of the surface of the cured product of the resin composition after the roughening treatment in Comparative Example 2.

The resin surfaces after the roughening treatment in Examples 5 and 6 and Comparative Example 2 were observed with an SEM. The results are shown in FIGS. 1 to 3, respectively. It is seen from FIGS. 1 to 3 that the resin layer remains on the surface after the roughening treatment in Examples 5 and 6, but in Comparative Example 2, the inorganic filler, spherical silica, is exposed on most parts on the surface of the cured product of the resin composition (insulating layer).

Evaluation of Mechanical Strength

The resin composition surfaces of the adhesive films obtained in Examples 1 and 2 and Comparative Example 1 were thermally cured at 180° C. for 90 minutes. The samples were then subjected to a tensile breaking strength measurement according to JIS K7127. The results are shown in Table 2, below.

Evaluation of Thermal Expansion Coefficient

The resin composition surfaces of the adhesive films obtained in Examples 1 and 2 and Comparative Example 1 were thermally cured at 180° C. for 90 minutes. The samples were formed into test pieces having a width of about 5 mm and a length of about 15 mm, which were subjected to a thermomechanical analysis measurement under the tensile mode using a thermomechanical analyzer (TMA), produced by Rigaku Denki Co., Ltd. The measurement was carried out twice at a load of 1 g and a temperature increase rate of 5° C. per minute. The average linear expansion coefficients at the second measurement from room temperature (23° C.) to 150° C. are shown in Table 2, below.

TABLE 2

| | Resin composition | | |
|---|---|---|---|
| | Example 1 | Example 2 | Comparative Example 1 |
| Tensile breaking strength (Mpa) | 105 | 95 | 80 |
| Thermal expansion coefficient (ppm) | 33 | 44 | 45 |

From the results given in Table 2, it is understood that the insulating layer formed by using the resin composition of the present invention has a low thermal expansion coefficient and an excellent tensile breaking strength.

Dynamic Viscoelastic Measurement of Resin Composition

The epoxy resin composition of the adhesive film obtained in Example 1 was subjected to dynamic viscoelastic measurement by using Model Rheosol-G3000, produced by UBM Corp. The measurement results are shown in FIG. 4. The measurement was carried out with an initial temperature of about 60° C., a temperature increase rate of 5° C. per minute, a measurement temperature interval of 2.5° C., and at an oscillation frequency of 1 Hz/deg. The melt viscosity values at the respective temperatures are shown in Table 3.

TABLE 3

| Temperature (° C.) | Melt viscosity (poise) |
|---|---|
| 90 | about 10,000 |
| 100 | about 6,000 |
| 110 | about 4,500 |
| 120 | about 3,500 |
| 130 | about 3,100 |

INDUSTRIAL APPLICATION

The resin composition, the adhesive film and prepreg for a multilayer printed wiring board prepared with the resin composition of the present invention are preferably used for an interlayer insulating material of a multilayer printed wiring board, especially a multilayer printed wiring board produced by a buildup method.

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. A resin composition, comprising:
   (A) an epoxy resin having 2 or more epoxy group in one molecule and which exists in a liquid state at a temperature of 20° C.;
   (B) an aromatic epoxy resin having 3 or more epoxy groups in one molecule and an epoxy equivalent of 200 or less;
   (C) a phenol type curing agent;
   (D) one or more resins selected from the group consisting of a phenoxy resin, a polyvinyl acetal resin, a polyamide resin, a polyamideimide resin, and mixtures thereof, and having a glass transition temperature of 100° C. or more; and
   (E) an inorganic filler,
   wherein:
   said inorganic filler (E) is present in an amount of 35% by weight or more based on the total weight of non-volatile components of said resin composition;
   said epoxy resin (A) and said aromatic epoxy resin (B) are present in a weight ratio of from 1:0.3 to 1:2 of said epoxy resin (A) to said aromatic epoxy resin (B);
   said phenol type curing agent (C) is present in an amount such that the ratio of total epoxy groups in said resin composition and phenolic hydroxyl groups in said phenol type curing agent (C) is from 1:0.5 to 1:1.5; and
   said resin (D) is present in an amount of from 2 to 20% by weight based on the total weight of non-volatile components of said resin composition.

2. The resin composition according to claim 1, wherein said epoxy resin (A) is an aromatic epoxy resin.

3. The resin composition according to claim 1, wherein said aromatic epoxy resin (B) has an epoxy equivalent of from 150 to 200.

4. The resin composition according to claim 1, wherein said aromatic epoxy resin (B) exists in a solid state at a temperature of 20° C.

5. The resin composition according to claim 1, wherein said inorganic filler (E) is present in an amount of from 35 to 70% by weight based on the total weight of non-volatile components of said resin composition.

6. The resin composition according to claim 1, wherein said epoxy resin (A) and said aromatic epoxy resin (B) are present in said resin composition in a total amount of from 10 to 50% by weight based on the total weight of non-volatile components of said resin composition.

7. A resin composition, comprising:
(A) an epoxy resin having 2 or more epoxy group in one molecule and which exists in a liquid state at a temperature of 200° C.;
(B) an aromatic epoxy resin having 3 or more epoxy groups in one molecule and an epoxy equivalent of 200 or less;
(C) a phenol type curing agent;
(D) one or more resins selected from the group consisting of a phenoxy resin, a polyvinyl acetal resin, a polyamide resin, a polyamideimide resin, and mixtures thereof, and having a glass transition temperature of 100° C. or more; and
(E) an inorganic filler,
wherein:
said inorganic filler (E) is present in an amount of 40% by weight or more based on the total weight of non-volatile components of said resin composition;
said epoxy resin (A) and said aromatic epoxy resin (B) are present in a weight ratio of from 1:0.3 to 1:2 of said epoxy resin (A) to said aromatic epoxy resin (B);
said phenol type curing agent (C) is present in an amount such that the ratio of total epoxy groups in said resin composition and phenolic hydroxyl groups in said phenol type curing agent (C) is from 1:0.5 to 1:1.5; and
said resin (D) is present in an amount of from 2 to 20% by weight based on the total weight of non-volatile components of said resin composition.

8. The resin composition according to claim 7, wherein the content ratio of the inorganic filler as the component (E) is from 40 to 70% by weight based on the total weight of non-volatile components of said resin composition.

9. An adhesive film, comprising a support film and a layer of a resin composition according to one of claims 1 to 6 formed thereon.

10. A process for producing a multilayer printed wiring board comprising:
(a) laminating an adhesive film according to claim 9 on one surface or both surfaces of a circuit board, to obtain a laminated adhesive film;
(b) optionally removing said support film therefrom;
(c) thermally curing said resin composition laminated on said circuit board, to obtain an insulating layer;
(d) removing said support film in a case where said support film exists;
(e) drilling said circuit board having said insulating layer formed thereon;
(f) roughening at least one surface of said insulating layer with an oxidizing agent;
(g) forming a conductor layer by plating on at least one surface of said insulating layer which has been roughened; and
(h) forming a circuit in said conductor layer.

11. The process of claim 10, wherein said support film is removed after said laminating (a) and before said thermally curing (c).

12. The process of claim 10, wherein said support film is removed after said thermally curing (c) and before said drilling (e).

13. The adhesive film according to claim 9, wherein said resin composition has a melt viscosity measured at a measurement starting temperature of 60° C., a temperature increase rate of 5° C. per minute, and a frequency of 1 Hz/deg, of from 4,000 to 50,000 poise at 90° C., from 2,000 to 21,000 poise at 100° C, from 900 to 12,000 poise at 110° C., from 500 to 9,000 poise at 1200° C., and from 300 to 15,000 poise at 130°.

14. A process for producing a multilayer printed wiring board comprising:
(a) laminating an adhesive film according to claim 13, on one surface or both surfaces of a circuit board, to obtain a laminated adhesive film;
(b) optionally removing said support film therefrom;
(c) thermally curing said resin composition laminated on said circuit board, to obtain an insulating layer;
(d) removing said support film in a case where said support film exists;
(e) drilling said circuit board having said insulating layer formed thereon; (f) roughening at least one surface of said insulating layer with an oxidizing agent;
(g) forming a conductor layer by plating on at least one surface of said insulating layer which has been roughened; and
(h) forming a circuit in said conductor layer.

15. The process of claim 14, wherein said support film is removed after said laminating (a) and before said thermally curing (c).

16. The process of claim 14, wherein said support film is removed after said thermally curing (c) and before said drilling (e).

17. A prepreg, comprising a reinforcing substrate in a sheet form, wherein said reinforcing substrate comprises fibers impregnated with a resin composition according to one of claims 1 to 6.

18. A multilayer printed wiring board, comprising an insulating layer formed of a cured product of a prepreg according to claim 17.

19. A process for producing a multilayer printed wiring board comprising:
(i) laminating a prepreg according to claim 17 on one surface or both surfaces of a circuit board;
(j) thermally curing said prepreg laminated on said circuit board, to obtain an insulating layer;
(k) drilling said circuit board having the insulating layer formed thereon;
(l) roughening at least one surface of said insulating layer with an oxidizing agent;
(m) forming a conductor layer by plating at least one surface of said insulating layer which has been roughened; and
(n) forming a circuit in said conductor layer.

20. A multilayer printed wiring board, comprising an insulating layer formed of a cured product of a resin composition according to one of claims 1 to 6.

* * * * *